United States Patent
Liu et al.

(10) Patent No.: US 9,608,633 B1
(45) Date of Patent: Mar. 28, 2017

(54) INTERFACE CIRCUIT WITH CONFIGURABLE VARIABLE SUPPLY VOLTAGE FOR TRANSMITTING SIGNALS

(71) Applicant: OMNIVISION TECHNOLOGIES, INC., Santa Clara, CA (US)

(72) Inventors: Min Liu, Fremont, CA (US); Yun Hak Koh, San Jose, CA (US); Charles Qingle Wu, Palo Alto, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/951,307

(22) Filed: Nov. 24, 2015

(51) Int. Cl.
*H03K 19/0185* (2006.01)
*H03K 19/00* (2006.01)

(52) U.S. Cl.
CPC . *H03K 19/0013* (2013.01); *H03K 19/018514* (2013.01)

(58) Field of Classification Search
CPC ............... H03K 19/0013; H03K 19/018514
USPC .................................................. 327/108, 333
See application file for complete search history.

(56) References Cited

U.S. PATENT DOCUMENTS

| | | | | |
|---|---|---|---|---|
| 6,130,557 A * | 10/2000 | Drapkin | ......... | H03K 19/018585 326/68 |
| 6,614,283 B1 * | 9/2003 | Wright | ............. | H03K 3/356113 326/68 |
| 6,924,689 B2 * | 8/2005 | Randazzo | ............... | G05F 3/242 326/63 |
| 7,176,740 B2 * | 2/2007 | Tachibana | ........ | H03K 3/356113 326/68 |
| 7,205,819 B2 * | 4/2007 | Davis | ............... | H03K 19/00323 326/63 |
| 7,397,279 B2 * | 7/2008 | Bhattacharya | . | H03K 19/017509 326/63 |
| 7,619,448 B2 | 11/2009 | Wu et al. | | |
| 8,928,365 B2 | 1/2015 | Li et al. | | |
| 2012/0307122 A1 * | 12/2012 | Liu | ........................... | G05F 1/56 348/332 |

(Continued)

OTHER PUBLICATIONS

Wong, K. J. et al., "A 27-mW 3.6-Gb/s I/O Transceiver", IEEE Journal of Solid-State Circuits, vol. 39, No. 4, Apr. 2004, pp. 602-612.

(Continued)

*Primary Examiner* — Ryan Jager
(74) *Attorney, Agent, or Firm* — Blakely Sokoloff Taylor & Zafman LLP

(57) ABSTRACT

An interface circuit includes a pre-driver that converts the single-ended signal to an intermediate differential signal having a first voltage swing responsive to a first supply voltage supplied to the pre-driver. An output driver is coupled to receive the intermediate differential signal from the pre-driver to convert the intermediate differential signal to an output differential signal coupled to be received by a load coupled to the output driver. The output differential signal has a second voltage swing responsive to a second supply voltage supplied to the output driver. An internal regulator is coupled to receive a variable supply voltage to supply the second voltage to the output driver. The second supply voltage is generated in response to a bias signal. A replica bias circuit is coupled to receive the variable supply voltage to generate the bias signal.

19 Claims, 3 Drawing Sheets

(56) References Cited

U.S. PATENT DOCUMENTS

2014/0035549 A1* 2/2014 Hafizi .................. G05F 3/08
323/311

OTHER PUBLICATIONS

Palmer, R. et al., "A 14mW 6.25Gb/s Transceiver in 90nm CMOS for Serial Chip-to-Chip Communications", 2007 IEEE International Solid-State Circuits Conference, Session 24, Multi-Gb/s Transceivers, 24.3, 2007 IEEE, pp. 440-441 and 614.

* cited by examiner

INTERFACE CIRCUIT WITH CONFIGURABLE VARIABLE SUPPLY VOLTAGE FOR TRANSMITTING SIGNALS

BACKGROUND INFORMATION

Field of the Disclosure

The present invention relates generally to circuits. More specifically, examples of the present invention are related to interface circuits that transmit signals.

Background

Electronic circuits consume power to operate. When communicating between electronic circuit elements, electronic signals are typically transmitted and received across electrical conductors coupled between the circuit elements. The communications are typically realized with electrical voltages and/or currents that are transmitted and received across the electrical conductors between the input and output circuitry of the electronic circuits.

There are tradeoffs that designers must face when designing electronic circuits that need to interface with other circuits. In some instances, it may be a requirement for a designer to choose interface circuitry that operates at lower voltages than the normal supply voltages that are used to supply power to other parts of the electronic circuits in order to realize power savings across the communications interface between the electronic circuits. However, powering the communication interface circuitry with lower voltages than other parts of the electronic circuits requires more complex and expensive power management, as well as large and expensive external capacitors. In other instances, it may be a requirement for a designer to choose powering the communication interface circuitry with the same supply voltages as other parts of the electronic circuits to enable simpler and less costly power management, which eliminate the need for the external capacitors. However, the higher voltages used in the transmit and receive circuitry of electronic circuits consequently result in increased power consumption with no power savings when communicating across the communications interface between the electronic circuits.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

Figure 1:
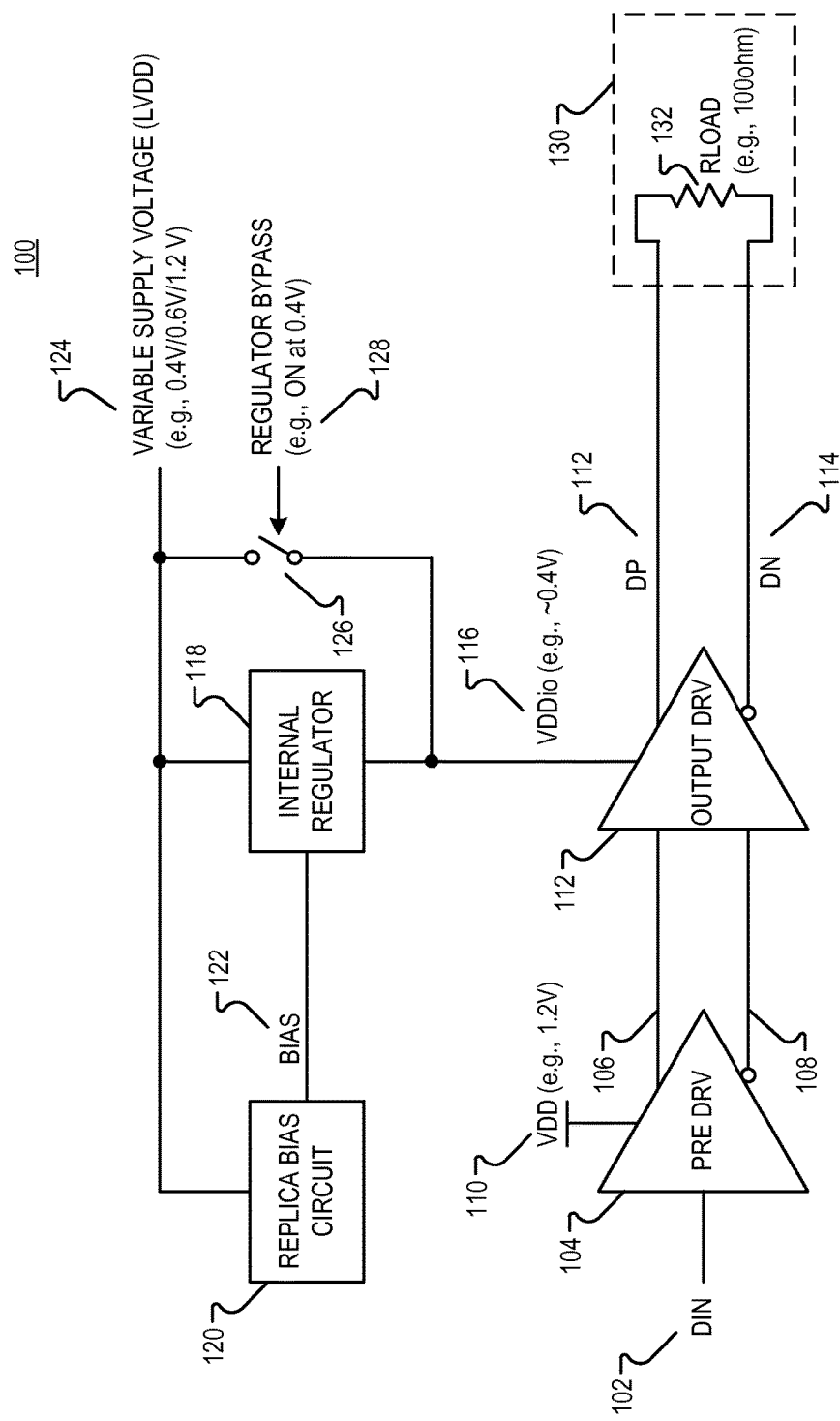
FIG. 1 is a block diagram illustrating one example of an interface circuit for transmitting a signal in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to interface circuits that transmit signals using a configurable variable supply voltage are disclosed. In the following description, numerous specific details are set forth in order to provide a thorough understanding of the present invention. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," an embodiment, "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. The following is a detailed description of the terms and elements used in the description of examples of the present invention by referring to the accompanying drawings.

As will be discussed, examples of interface circuits that transmit signals using a configurable variable supply voltage are described in detail below, which provides circuit designers flexibility to configure interface circuits for power savings or cost savings in accordance with the teachings of the present invention.

To illustrate, FIG. 1 is a block diagram illustrating one example of an interface circuit 100 for transmitting a signal in accordance with the teachings of the present invention. As shown in the depicted example, interface circuit 100 includes a pre-driver 104 coupled to receive a data input signal DIN 102. In one example, data input signal DIN 102 is a single-ended signal, which may be represented with a voltage signal on a single conductor as shown. In the example, pre-driver 104 is coupled to convert the single-ended signal data input signal DIN 102 to an intermediate differential signal at the differential pair of outputs 106 and 108 of pre-driver as shown. In one example, pre-driver 104 is coupled to be powered from a first supply voltage VDD 110, to produce a first voltage swing across the differential pair of outputs 106 and 108 when generating the intermediate differential signal output of pre-driver 104. In one example, the first supply voltage VDD 110 is equal to a "normal" supply voltage, such as for example 1.2 volts, and the first voltage swing across the differential pair of outputs 106 and 108 ranges from 0 volts to 1.2 volts. In other examples, it is appreciated that the first supply voltage VDD 110 and the first voltage swing may have other values and still enjoy the benefits of the present invention. In the example, the differential pair of outputs 106 and 108 are complementary outputs, as represented with the small circle on output 108 and no circle on output 106. Therefore, when the signal on output 106 is high, the signal on output 108 is low, and vice versa.

An output driver 112 is coupled to receive the intermediate differential signal from the differential pair of outputs 106 and 108 of the pre-driver 104. In the example, the output driver 112 is coupled to convert the intermediate differential signal from the differential pair of outputs 106 and 108 to an output differential signal at the differential pair of outputs DP 112 and DN 114 of output driver 112, which is coupled to be a received by an external receiver 130, as shown. In the depicted example, receiver 130 provides an external load RLOAD 132 termination across the differential pair of outputs DP 112 and DN 114. In one example, load RLOAD 132 provides a resistance of 100 ohms. In one example, output driver 112 is coupled to be powered from a second supply voltage VDDio 116, to produce a second voltage swing across the differential pair of outputs DP 112 and DN 114 when generating the output differential signal output of output driver 112. In one example, the second supply voltage VDDio 116 is equal to a "lower" supply voltage, such as for example 0.4 volts, and the second voltage swing across the differential pair of outputs DP 112 and DN 114 ranges from 0.1 volts to 0.3 volts. Thus, the second supply voltage VDDio 116 is less than the first supply voltage VDD 110, and the second voltage swing is less than the first voltage swing. In other examples, it is appreciated that the second supply voltage VDDio 116 and the second voltage swing may have other values and still enjoy the benefits of the present invention. In the example, the differential pair of outputs DP 112 and DN 114 are complementary outputs, as represented with the small circle on output DN 114 and no circle on output DP 112. Therefore, when the signal on output DP 112 is high, the signal on output DN 114 is low, and vice versa.

As shown in the depicted example, an internal regulator 118 is coupled to receive a variable supply voltage (LVDD) 124 to supply the second voltage VDDio 116 to the output driver 112. In one example, internal regulator 118 regulates the second supply voltage VDDio 116, and may therefore provide an improved power supply rejection ratio (PSRR) when generating second supply voltage VDDio 116. In one example, internal regulator 118 is coupled to generate the second supply voltage VDDio 116 in response to a bias signal 122, which is coupled to be received from replica bias circuit 120. In one example, the replica bias circuit 120 is also coupled to receive the variable supply voltage 124 as shown to generate the bias signal 122.

In the illustrated example, it is appreciated that variable supply voltage 124 is user configurable, and therefore provides the designer flexibility when choosing between power savings or simpler power management in accordance with the teachings of the present invention. For instance, in one example, variable supply voltage 124 can be configured to be equal to 0.4 volts, which provides increased power savings due to a lower voltage compared to for example 1.2 volts. In another example, variable supply voltage 124 can be configured to be equal to the same voltage, such as for example 1.2 volts, as first supply voltage VDD 110, which therefore enables simpler power management, and reduces the need for an external capacitor due to significant inrush currents that could result from different voltages. In yet another example, variable supply voltage 124 can be configured to an intermediate voltage, such as for example 0.6 volts, which can still provide some power savings in accordance with the teachings of the present invention.

In one example, it is noted that if the variable supply voltage 124 is configured to be the same voltage as the second supply voltage VDDio 116, such as for example 0.4 volts, the user has the option to turn on, or close, the regulator bypass switch 126, which is coupled across the internal regulator 118, in response to a regulator bypass signal 128 to selectively supply the variable supply voltage 124 directly to the output driver 112. In such an example, the feedback loop provided with replica bias circuit 120 is therefore disabled, and the internal regulator 118 functions as a small resistor instead.

Figure 2:
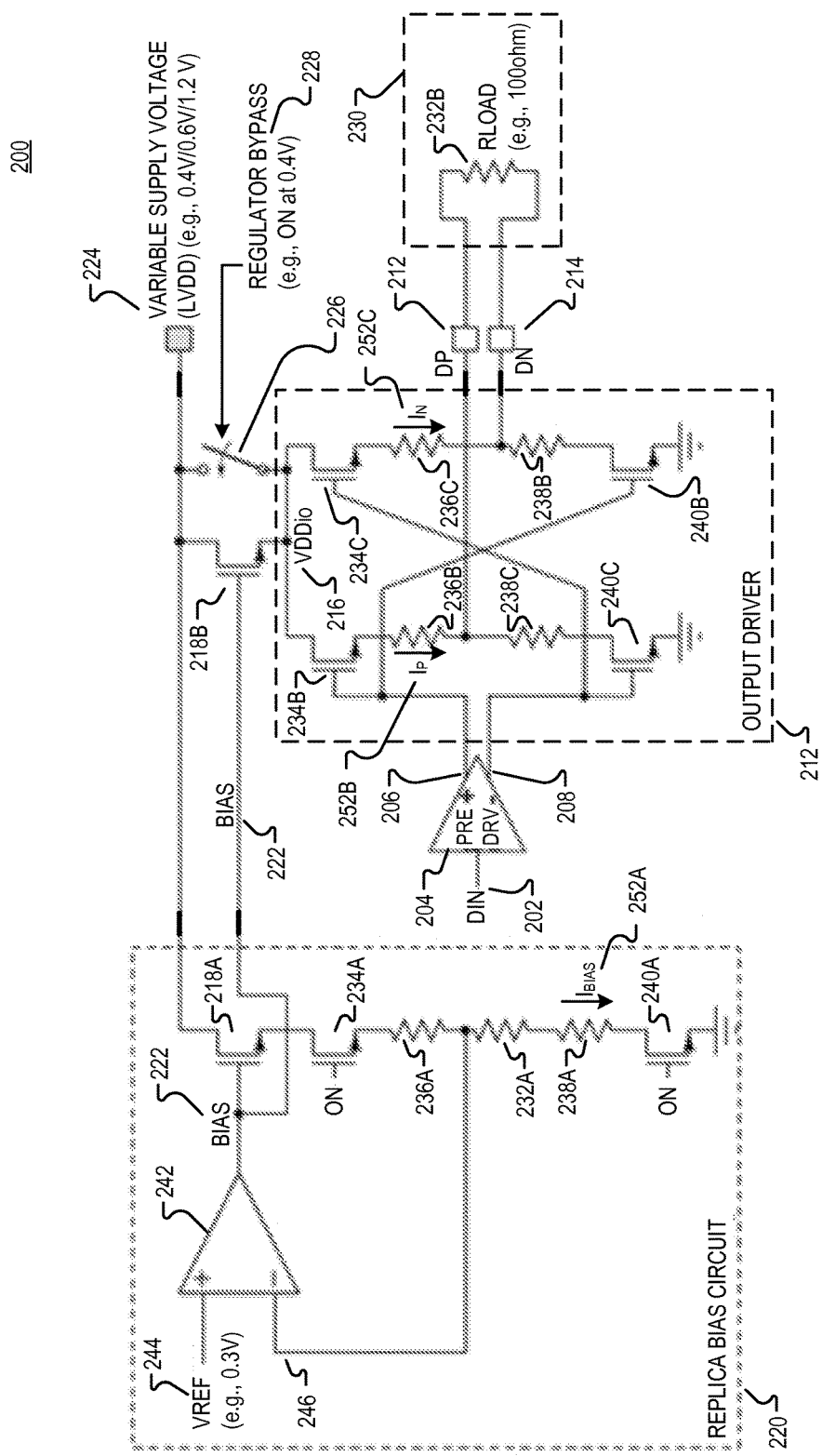
FIG. 2 is a schematic illustrating a detailed example of an interface circuit for transmitting a signal in accordance with the teachings of the present invention.

FIG. 2 is a schematic illustrating a detailed example of an interface circuit 200 for transmitting a signal in accordance with the teachings of the present invention. In the depicted example, it is appreciated that interface circuit 200 of FIG. 2 may be one of example of interface circuit 100 of FIG. 1, and that similarly named and numbered elements referenced below are coupled and function similar to as described above.

As illustrated in the depicted example, interface circuit 200 of FIG. 2 includes a pre-driver 204 coupled to convert a single-ended signal data input signal DIN 202 to an intermediate differential signal at the differential pair of complementary outputs 206 and 208. An output driver 212 is coupled to receive the intermediate differential signal from the differential pair of outputs 206 and 208 to convert the intermediate differential signal to an output differential signal at the differential pair of outputs DP 212 and DN 214 of output driver 212, which is coupled to be a received by an external receiver 230, as shown. In the depicted example, receiver 230 provides an external load RLOAD 232B termination across the differential pair of outputs DP 212 and DN 214. In one example, load RLOAD 232B provides a resistance of 100 ohms. In one example, output driver 212 is coupled to be powered from a second supply voltage VDDio 216, to produce a second voltage swing across the complementary differential pair of outputs DP 212 and DN 214.

As shown in the depicted example, an internal regulator 218B is coupled to receive a variable supply voltage (LVDD) 224 to supply the second voltage VDDio 216 to the output driver 212. In one example, internal regulator 218B regulates the second supply voltage VDDio 216, and may therefore provide an improved power supply rejection ratio (PSRR) when generating second supply voltage VDDio 216. In the example depicted in FIG. 2, internal regulator 218B is a source-follower coupled transistor, which includes a control terminal coupled to receive bias signal 222 from replica bias circuit 220 to generate the second supply voltage VDDio 216 as shown. In one example, the replica bias circuit 220 is also coupled to receive the variable supply voltage 224 as shown to generate the bias signal 222.

In the illustrated example, variable supply voltage 224 supplied to replica bias circuit 220 and internal regulator 218B is user configurable, and therefore provides the designer flexibility with choosing between power savings or simpler power management in accordance with the teachings of the present invention. For instance, in one example, variable supply voltage 224 can be configured to be equal to 0.4 volts, which provides increased power savings due to the lower voltage when compared to 1.2 volts. In another example, variable supply voltage 224 can be configured to be equal to 1.2 volts, which could be the same voltage as VDD, and therefore enable simpler overall power management and reduce the need for an external capacitor due to different voltages. In yet another example, variable supply voltage 224 can be configured to an intermediate voltage such as for example 0.6 volts, which can still provide some power savings in accordance with the teachings of the present invention.

In one example, it is noted that if the variable supply voltage 224 is configured to be the same voltage as the second supply voltage VDDio 216, such as for example 0.4 volts, the user has the option to turn on, or close, the regulator bypass switch 226, which is coupled across the internal regulator 218B, in response to a regulator bypass signal 228 to selectively supply the variable supply voltage 224 directly to the output driver 212. In such an example, the feedback loop provided with replica bias circuit 220 is therefore disabled, and the internal regulator 218B functions as a small resistor instead.

In the example depicted in FIG. 2, the output driver 212 includes first and second circuit paths through which first and second internal currents $I_P$ 252B and $I_N$ 252C are conducted, respectively, to generate first and second output signals of the output differential signal at output DP 212 and output DN 214. In the example depicted in FIG. 2, the first circuit path through which first internal current $I_P$ 252B is conducted includes transistor 234B, resistor 236B, external resistor RLOAD 232B (in external receiver circuit 230), resistor 238B, and transistor 240B. The second circuit path through which second internal current $I_N$ 252C is conducted includes transistor 234C, resistor 236C, external resistor RLOAD 232B (in external receiver circuit 230), resistor 238C, and transistor 240C.

In operation, the first and second complementary outputs 206 and 208 of the pre-driver 204 that generate the intermediate differential signal are utilized to control the transistors of the first and second circuit paths of output driver 212. For instance, in the depicted example, the first complementary output 206 of the pre-driver 204 is coupled to control transistor 234B and transistor 240B in the first circuit path. The second complementary output 208 of the pre-driver 204 is coupled to control transistor 234C and transistor 240C in the second circuit path. Since the outputs 206 and 208 of pre-driver 204 are complementary outputs, it is appreciated that only one of first internal current $I_P$ 252B and second internal current $I_N$ 252C conduct at a time.

Replica bias circuit 220 includes a replica bias circuit path through which a bias current $I_{BIAS}$ 252A is conducted to generate the bias signal 222. In the example depicted in FIG. 2, the replica bias circuit path through which bias current $I_{BIAS}$ 252A is conducted includes transistor 234A, resistor 236A, resistor 232A, resistor 238A, and transistor 240A as shown. In the example, the control terminals of transistors 234A and 240A are coupled to receive an "ON" signal such that the transistor 234A and 240A switches remain closed and conduct the bias current $I_{BIAS}$ 252A.

In one example, the first circuit path, and the second circuit path of output driver 212, and the bias circuit path of replica bias circuit 220 are all replicas of one another such that the bias current $I_{BIAS}$ 252A is proportional to the first internal current $I_P$ 252B when the first internal current $I_P$ 252B is conducted, and such that the bias current $I_{BIAS}$ 252A is proportional to the second internal current $I_N$ 252C when the second internal current $I_N$ 252C is conducted.

For instance, in one example, the bias current $I_{BIAS}$ 252A is substantially equal to the first internal current $I_P$ 252B when the first internal current $I_P$ 252B is conducted, and the bias current $I_{BIAS}$ 252A is substantially equal to the second internal current $I_N$ 252C when the second internal current $I_N$ 252C is conducted. As such, transistors 234A, 234B, and 234C are replicas of one another. In addition, transistors 240A, 240B, and 240C are also replicas of one another.

Similarly, resistors 236A, 236B, and 236C have substantially the same resistance, and resistors 238A, 238B, and 238C have substantially the same resistance. Furthermore, the resistance of resistor 232A is substantially the same as the resistance RLOAD 232B of the receiver 230. In one example, RLOAD 232B is substantially equal to 100 ohms.

In another example, replica bias circuit 220 is a scaled down version of output driver 212, to save power and size. For instance, in one example, bias current $I_{BIAS}$ 252A is scaled down to be for example 25% of the first internal current $I_P$ 252B or second internal current $I_N$ 252C, when conducted. In such an example, for the 0.25× scaled down version of replica bias circuit 220, transistors 234A and 240A can be 0.25 times the sizes of transistors 234B and 234C, and transistors 240B and 240C, respectively. In the example, resistor 236A can be 4 times the values of resistors 236B and 236C, resistor 238A can be 4 times the values of resistors 238B and 238C, and resistor 232A can be 4 times the value of the resistance RLOAD 232B. It is appreciated of course that these 25% scaling factor examples for replica bias circuit 220 are provided for explanation purposes, and that in other examples, replica bias circuit 220 may be scaled by other factors in accordance with the teachings of the present invention.

As shown in the example depicted in FIG. 2, the replica bias circuit 220 also includes a comparator 242 coupled having a first input (illustrated as non-inverting input of comparator 242 in FIG. 2) coupled to receive a reference voltage VREF 244, and a second input (illustrated as inverting input of comparator 242 in FIG. 2) coupled to receive a feedback signal 246 from the bias circuit path, to generate the bias signal 222 at the output of comparator 242. In the example, the feedback signal is generated at the terminal between resistor 236A and resistor 232A along the bias circuit path. In one example, the reference voltage VREF 244 is equal for example to 0.3 volts, which is compared to the feedback signal 246 to generate the bias signal 222. In other examples, it is appreciated that other voltages may also used for reference voltage VREF 244 and still enjoy the benefits in accordance with the teachings of the present invention.

Replica bias circuit 220 also includes a transistor 218A coupled to bias circuit path as shown. In the depicted example, it is appreciated that transistor 218A is source-follower coupled transistor and is a replica of transistor 218B. Like transistor 218B of the internal regulator, transistor 218A is also coupled to receive the variable supply voltage 224. Transistor 218A also includes a control terminal coupled to receive the bias signal 222. Thus, in one example, the currents that are conducted through transistor 218A and transistor 218B in response to the bias signal 222 are substantially equal to one another. In another example in which replica bias circuit 220 is a scaled version of output driver 212, the currents that are conducted through transistor 218A and transistor 218B are correspondingly proportional to one another. It is noted in one example in which the reference signal VREF 244 is equal to 0.3 volts, the bias signal 222 used to control transistor 218B of the internal regulator provides the second supply voltage VDDio 216 equal to approximately 0.4 volts, which results in the second voltage swing of 0.1 volts to 0.3 volts in the output differential signal supplied to receiver 230 through output terminals DP 212 and DN 214 in accordance with the teachings of the present invention.

Figure 3:
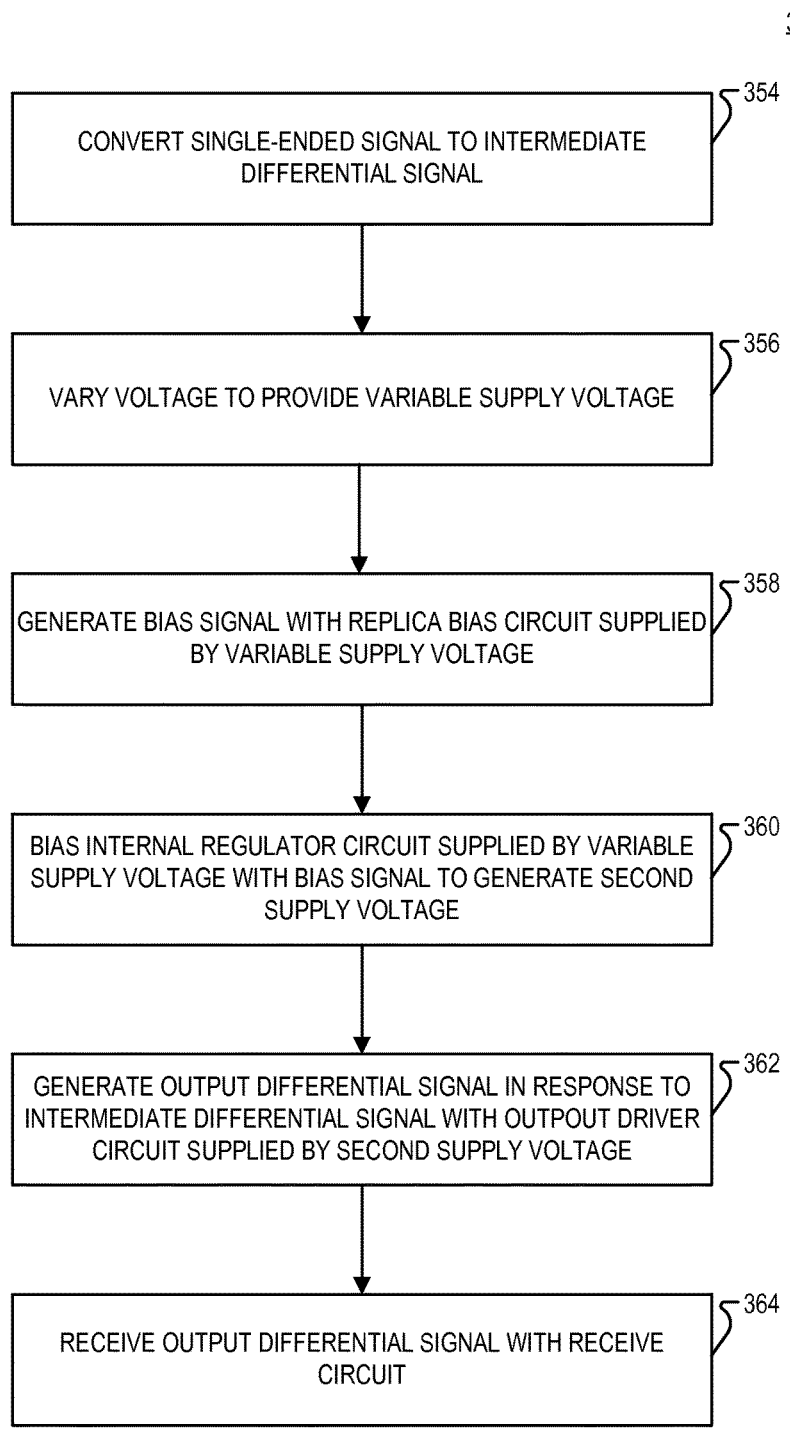
FIG. 3 is a flow chart illustrating one example of process for transmitting a signal to a receiver in accordance with the teachings of the present invention.

FIG. 3 is a flow chart illustrating one example of process 300 for transmitting a signal to a receiver in accordance with the teachings of the present invention. In the depicted example, it is appreciated that process 300 of FIG. 3 describes a process that may utilize an example interface circuit 200 of FIG. 2 or an example interface circuit 100 of FIG. 1, and that similarly named and numbered elements referenced below are coupled and function similar to as described above. Accordingly, elements in FIG. 1 and/or FIG. 2 may be also referred to below for explanation purposes. In addition, it is appreciated that the order in which some or all of the process occurs in FIG. 3 should not be deemed limiting. Rather, one of ordinary skill in the art having the benefit of the present disclosure will understand that some of the process may be executed in a variety of orders not illustrated, or even in parallel.

At process block 354 a single-ended signal is converted to an intermediate differential signal with a pre-driver circuit coupled to be supplied power from a first supply voltage. For instance, as described in the examples above, a pre-driver 104 or 204 may be coupled to receive a single-ended data input signal 102 or 202 to be converted to an intermediate differential signal at outputs 106 and 108, or outputs 206 and 208. At process block 356, a voltage is varied to provide a variable supply voltage. Thus, a variable supply voltage 124 or 224 may be customized to be one of a plurality of different voltages, such as for example 0.4 volts, 0.6 volts, 1.2 volts, etc.

At process block 358, a bias signal is generated with a replica bias circuit coupled to be supplied power from the variable supply voltage. For example, replica bias circuit 120 or 220 may be coupled to the configurable 0.4 volts, or 0.6 volts, 1.2 volts, etc. to generate bias signal 122 or 222. At process block 360, an internal regulator circuit supplied with the configurable 0.4 volts, 0.6 volts, 1.2 volts, etc., is biased with bias signal 122 or 222 to generate a second supply voltage. For instance, internal regulator 118 or 218B is biased with bias signal 122 or 222 to generate VDDio 116 or 216.

At process block 362, an output differential signal is generated in response to the intermediate differential signal with an output driver circuit coupled to be supplied power from the second supply voltage. For example, an output differential signal is generated at outputs DP 112 and DN 114, or outputs DP 212 and DN 214 in response to the intermediate differential signal from outputs 106 and 108, or outputs 206 and 208. At process block 364, the output differential signal is received by a receiver circuit. For instance, receiver circuit 130 or 230 is coupled to receive the output differential signal from output driver 112 or 212.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An interface circuit for transmitting a signal, comprising:
   a pre-driver coupled to receive a single-ended signal, wherein the pre-driver is coupled to convert the single-ended signal to an intermediate differential signal, wherein the intermediate differential signal has a first voltage swing responsive to a first supply voltage supplied to the pre-driver;
   an output driver coupled to receive the intermediate differential signal from the pre-driver, wherein the output driver is coupled to convert the intermediate differential signal to an output differential signal coupled to be received by a load coupled to the output driver, wherein the output differential signal has a second voltage swing responsive to a second supply voltage supplied to the output driver;
   an internal regulator coupled to receive a variable supply voltage to supply the second voltage to the output driver, wherein the second supply voltage is generated in response to a bias signal; and
   a replica bias circuit coupled to receive the variable supply voltage to generate the bias signal coupled to be received by the internal regulator.

2. The interface circuit of claim 1, wherein the output driver includes first and second circuit paths through which first and second internal currents are conducted, respectively, to generate first and second output signals of the output differential signal, wherein the replica bias circuit includes a bias circuit path through which a bias current is conducted to generate the bias signal, wherein the first circuit path, the second circuit path, and the bias circuit path are all replicas of one another such that the bias current is proportional to the first internal current when the first internal current is conducted, and such that the bias current is proportional to the second internal current when the second internal current is conducted.

3. The interface circuit of claim 2, wherein the bias current is substantially equal to the first internal current when the first internal current is conducted, and wherein the bias current is substantially equal to the second internal current when the second internal current is conducted.

4. The interface circuit of claim 2, wherein the replica bias circuit comprises:
   a comparator coupled having a first input coupled to receive a reference voltage, and a second input coupled to receive a feedback signal from the bias circuit path, wherein the comparator has an output coupled to generate the bias signal; and
   a first transistor coupled to bias circuit path, wherein the first transistor includes a control terminal coupled to receive the bias signal, wherein the first transistor is coupled to receive the variable supply voltage, wherein the bias current is conduced through the first transistor and the bias circuit path in response to the bias signal.

5. The interface circuit of claim 4, wherein the internal regulator comprises a second transistor coupled to the first and second circuit paths, wherein the second transistor is coupled to receive the variable supply voltage, wherein the second transistor includes a control terminal coupled to receive the bias signal such that the second voltage supplied to the output driver is generated in response to the bias signal.

6. The interface circuit of claim 5, wherein the first transistor is a source-follower coupled transistor, and wherein the second transistor is a source-follower coupled transistor.

7. The interface circuit of claim 2 wherein each one of the first circuit path, the second circuit path, and the bias circuit path includes:
a third transistor;
a first resistor coupled to the third transistor;
a second resistor coupled to the first resistor;
a third resistor coupled to the second resistor; and
a fourth transistor coupled to the third resistor.

8. The interface circuit of claim 7, wherein the first and second circuit paths provide first and second complementary outputs of the output driver to generate the output differential signal coupled to be received by the load, wherein the second resistor in the first and second circuit paths is a load resistance of the load, and wherein the second resistor in the bias circuit path has a resistance proportional to the load resistance of the load.

9. The interface circuit of claim 7, wherein the pre-driver has first and second complementary outputs coupled to generate the intermediate differential signal, wherein the first complementary output of the pre-driver is coupled to control the third and fourth transistors in the first circuit path, and wherein the second complementary output of the pre-driver is coupled to control the third and fourth transistors in the second circuit path.

10. The interface circuit of claim 1 further comprising a regulator bypass switch coupled across the internal regulator to selectively supply the variable supply voltage directly to the output driver.

11. The interface circuit of claim 1, wherein the second voltage swing of the output differential signal is less than the first voltage swing of the intermediate differential signal.

12. The interface circuit of claim 1, wherein the load is a receive circuit coupled to receive the output differential signal from the output driver.

13. A method of transmitting a signal to a receive circuit, comprising:
converting a single-ended signal to an intermediate differential signal with a pre-driver circuit coupled to be supplied power from a first supply voltage;
varying a voltage to provide a variable supply voltage;
generating a bias signal with a replica bias circuit coupled to be supplied power from the variable supply voltage;
biasing an internal regulator circuit coupled to receive the variable supply voltage to generate a second supply voltage in response to the bias signal; and
generating an output differential signal in response to the intermediate differential signal with an output driver circuit coupled to be supplied power from the second supply voltage, wherein the output differential signal is coupled to be received by the receive circuit.

14. The method of claim 13, further comprising bypassing the internal regulator circuit if the variable supply voltage is equal to the second supply voltage.

15. The method of claim 13, wherein generating the bias signal comprises:
conducting a bias current through a bias circuit path included in the replica bias circuit;
comparing a reference voltage to a feedback signal generated along the bias circuit path to generate the bias signal; and
controlling a first transistor along the bias circuit path in response to the bias signal to control the bias current through the bias circuit path.

16. The method of claim 15, wherein controlling the first transistor along the bias circuit path in response to the bias signal comprises controlling a first source-follower coupled transistor along the bias circuit path in response to the bias signal, and
wherein biasing the internal regulator circuit comprises controlling a second source-follower coupled transistor coupled to receive the variable supply voltage to generate the second supply voltage in response to the bias signal.

17. The method of claim 16, wherein the pre-driver circuit has first and second complementary outputs coupled to generate the intermediate differential signal, wherein generating the output differential signal comprises:
controlling a first internal current through a first circuit path included in the output driver circuit in response to the first complementary output of the pre-driver circuit;
controlling a second internal current through a second circuit path included in the output driver circuit in response to the second complementary output of the pre-driver circuit; and
generating the output differential signal at first and second complementary outputs of the output driver circuit, wherein the first complementary output of the output driver circuit is generated along the first circuit path, and wherein the second complementary output of the output driver circuit is generated along the second circuit path.

18. The method of claim 17, wherein the first circuit path, the second circuit path, and the bias circuit path are all replicas of one another such that the bias current is proportional to the first internal current when the first internal current is conducted in response to the first complementary output of the pre-driver circuit, and such that the bias current is proportional to the second internal current when the second internal current is conducted in response to the second complementary output of the pre-driver circuit.

19. The method of claim 18, wherein the bias current is substantially equal to the first internal current when the first internal current is conducted, and wherein the bias current is substantially equal to the second internal current when the second internal current is conducted.

* * * * *